(12) United States Patent
Nguyen et al.

(10) Patent No.: US 11,469,493 B2
(45) Date of Patent: Oct. 11, 2022

(54) ELECTRONIC DEVICE HAVING A HOUSING WITH EMBEDDED ANTENNA

(71) Applicant: MUNIC, Villejuif (FR)

(72) Inventors: Frédéric Nguyen, Villejuif (FR); Aaron Solomon, Villejuif (FR)

(73) Assignee: MUNIC, Villejuif (FR)

( * ) Notice: Subject to any disclaimer, the term of this patent is extended or adjusted under 35 U.S.C. 154(b) by 110 days.

(21) Appl. No.: 16/924,578

(22) Filed: Jul. 9, 2020

(65) Prior Publication Data

US 2021/0013600 A1 Jan. 14, 2021

(30) Foreign Application Priority Data

Jul. 9, 2019 (EP) ..................................... 19315063

(51) Int. Cl.
| | |
|---|---|
| *H01Q 1/24* | (2006.01) |
| *H01Q 1/40* | (2006.01) |
| *H05K 1/02* | (2006.01) |
| *H05K 1/11* | (2006.01) |
| *H05K 7/14* | (2006.01) |

(52) U.S. Cl.
CPC ............. *H01Q 1/40* (2013.01); *H05K 1/0243* (2013.01); *H05K 1/11* (2013.01); *H05K 7/1427* (2013.01); *H05K 2201/10098* (2013.01)

(58) Field of Classification Search
CPC .......... H01Q 1/40; H05K 1/0243; H05K 1/11; H05K 7/1427; H05K 2201/10098
USPC ...................................................... 343/702
See application file for complete search history.

(56) References Cited

U.S. PATENT DOCUMENTS

| | | | |
|---|---|---|---|
| 7,659,853 B2* | 2/2010 | Chen ...................... | H01Q 21/30 343/700 MS |
| 2002/0110674 A1 | 8/2002 | Reil et al. | |
| 2007/0241971 A1* | 10/2007 | Tsujimura ............. | G06F 1/1698 343/702 |
| 2008/0150810 A1* | 6/2008 | Sugiyama .............. | H01Q 5/378 343/702 |
| 2008/0150811 A1 | 6/2008 | Honda et al. | |
| 2012/0235879 A1* | 9/2012 | Eder ........................ | H01Q 1/38 343/873 |
| 2013/0076573 A1* | 3/2013 | Rappoport ............. | H01Q 1/243 343/702 |

FOREIGN PATENT DOCUMENTS

| | | |
|---|---|---|
| EP | 2128841 | 12/2009 |
| KR | 20130051054 | 5/2013 |

OTHER PUBLICATIONS

European Search Report for corresponding European Application No. EP 19 31 5063, dated Jan. 9, 2020—2 pages.

\* cited by examiner

*Primary Examiner* — Binh B Tran
(74) *Attorney, Agent, or Firm* — Dority & Manning, P.A.

(57) ABSTRACT

Electronic device having at least one main antenna (1) where such antenna is formed as a conductive layer on walls of a housing (10) of the electronic device through a laser direct structuring process and has a first portion (2, 3) on an internal part of the housing, a second portion (4) forming a junction area on an edge between an interior part and an exterior part of the housing and a third portion (5) on an outer part of the housing in electrical continuity with the first portion through the junction area.

25 Claims, 3 Drawing Sheets

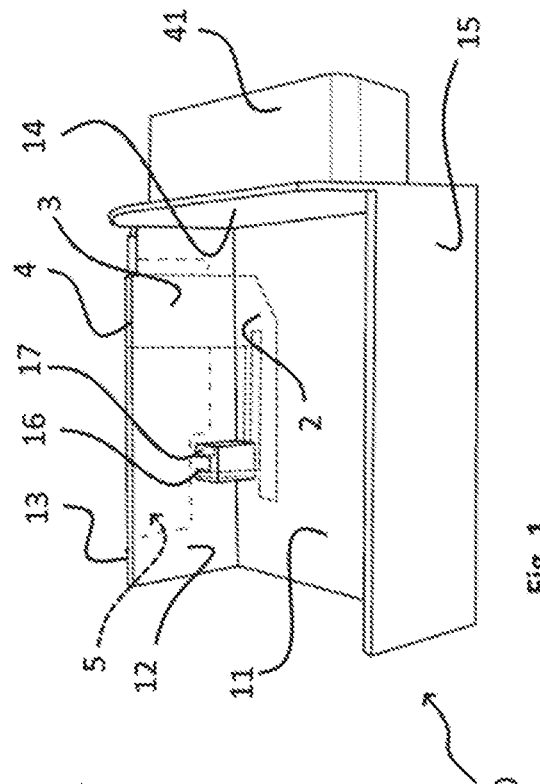
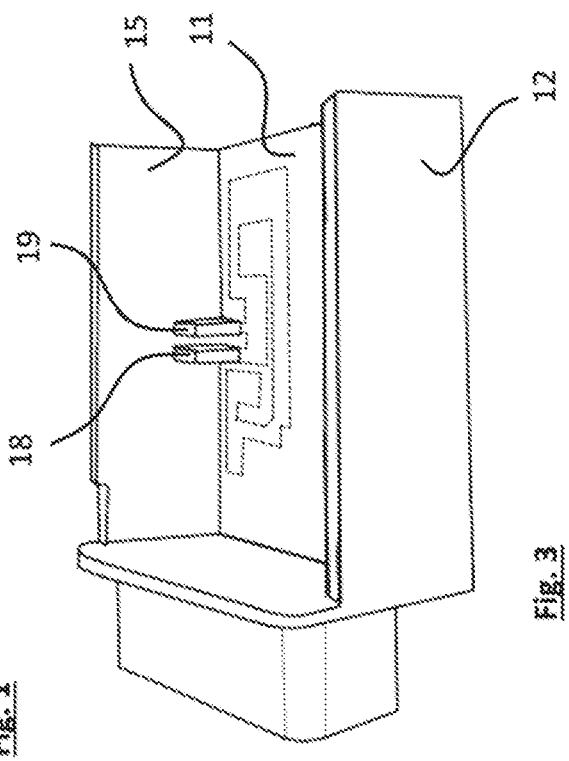
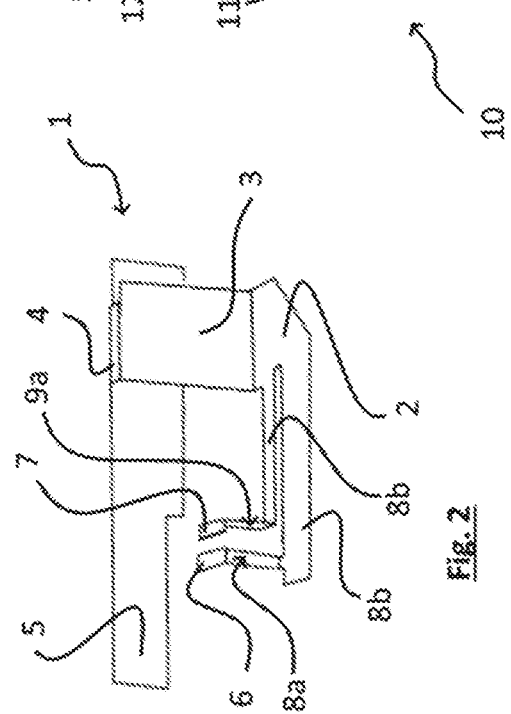
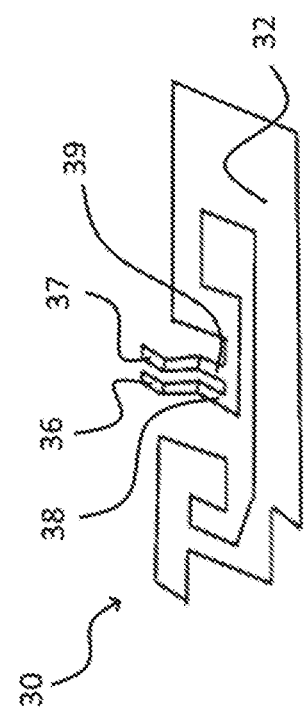
Fig. 1
Fig. 2
Fig. 3
Fig. 4

ELECTRONIC DEVICE HAVING A HOUSING WITH EMBEDDED ANTENNA

FIELD OF THE INVENTION

The present disclosure relates to electronic devices having a housing on which an antenna is directly drawn through laser direct structuring.

The invention concerns in particular an electronic on board device to be connected on a diagnostic socket connector in a vehicle passenger compartment and having 4G and/or Wifi emitting/receiving capabilities.

Automotive vehicles comprise a diagnostic socket connector which is usually located close to the fuse box in a compartment under the steering wheel or located in the glove compartment The diagnostic socket connector receives the on board diagnostic wiring used to monitor the electronic control units of the vehicle. The electronic device of the description is a telematics device that plugs itself in the diagnostic socket connector of a vehicle to provide instant access to the diagnostic data and real time monitoring of functions of the vehicle and on board diagnostic data.

The location of the diagnostic socket connector in a car is however not appropriate for a good radio signal transmission and the present invention intends to provide an improved antenna system where an antenna is a conductive layer incorporated in the housing of the device.

BACKGROUND

The principle of laser direct structuring (LDS) provides integration of conductive layers on plastics filled with specific additives activated through irradiation with laser energy in such a way that the additives provide an anchoring material and catalyst for reductive copper deposition plating. A LDS process is known for example from document US2002/0110674 A1.

Such a process permits to manufacture composite parts such as telephone bodies having embedded antennas as an example.

In automotive applications however and especially for electronic units within the engine compartments realization of antennas is difficult and specific problems of EMC arise.

SUMMARY

The present disclosure is intended to provide a design of electronic device and electronic device housing provided with one or more antennas in order to enable the device to communicate wirelessly despite the unfavorable environment in which the electronic device is used.

In this regard, the present disclosure proposes an electronic device having at least one main antenna wherein such antenna is formed as a conductive layer on walls of a housing of the electronic device through a laser direct structuring process comprising deposition of a copper layer. The antenna has a first portion on an internal part of the housing, a second portion forming a junction area on an edge between an interior part and an exterior part of the housing and a third portion on an outer part of the housing in electrical continuity with the first portion through the junction area.

The antenna is obtained through laser direct structuring on multiple sides of the housing. This has the advantage of providing an antenna with an increased surface, using different planes and having a planar element on at least an outer side of the housing.

The provided antenna is adapted to harsh environment and has better emitting and receiving characteristics than an antenna formed on an inner side of a housing.

In a particular embodiment, the first portion comprises a first flat part on a first wall of the housing, a second flat part on a second wall of the housing perpendicular to the first wall, said main antenna being folded at a junction between the first flat part and the second flat part.

This provides a larger receiving and emitting area.

The device comprising a PCB received on at least first stud elements in the housing, preferably the first portion comprises connecting members for contacting connecting tracks of the PCB extending onto said stud elements, and said connecting members extend from the first wall onto the stud elements to contact said connecting tracks.

The connection between the PCB and the antenna does not need connecting wires and is directly done between the stud elements of the housing and the PCB.

In a particular embodiment, the first wall is a bottom wall of the housing extending in a plane parallel to the PCB. This together with the stud elements allows the PCB to be kept at distance from the planar antenna element inside the housing.

Said stud elements may be perpendicular to the bottom wall of the housing and extend along said second wall which forms a sidewall of the housing.

In a particular embodiment, said main antenna comprises a first plane on the bottom wall of the housing a second plane on the interior side of the sidewall of the housing, a junction segment on an edge of said sidewall and a third plane on the outer side of said sidewall.

Connections between tracks of the PCB and connecting members on said stud elements may be done through springy contact elements located on said PCB.

The electronic device may comprise a second antenna also made through a laser direct structuring process, connected to the PCB through second stud elements. Such second antenna may also extend inside and outside the housing as for the main antenna.

In another embodiment the disclosure concerns an electronic device having at least one main antenna wherein such antenna is formed as a conductive layer on walls of a housing of the electronic device through a laser direct structuring process comprising deposition of a copper layer and has a first portion on an internal part of the housing, a second portion forming a first junction area on an edge between an interior part and an exterior part of the housing, a third portion on an outer part of the housing in electrical continuity with the first portion through the first junction area and a second junction area connecting said third portion to connecting tracks inside said housing and wherein the first portion comprises a first flat area on a first wall of the housing, a second flat area on a second wall of the housing perpendicular to the first wall so that said first flat area and second flat area are perpendicular, said main antenna being folded at an inner junction between said first flat area and said second flat area. The third portion lies on the outer portion of the housing, this increasing the emitting/receiving capabilities of the antenna.

In a specific embodiment, the housing comprises a connector housing.

In a preferred embodiment, the third portion of the main antenna is wider than the first and second portions.

The PCB may comprise pin contacts inserted in a rear wall of said connector housing and protruding within a skirt of said connector housing.

Preferably, the thickness of the copper layer is between 5 µm and 10 µm while the thickness of the walls is between 1 mm and 3 mm.

In addition, the copper layer may be covered by a protective nickel layer.

BRIEF DESCRIPTION OF THE DRAWINGS

A detailed description of exemplary embodiments of the invention will be discussed hereunder in reference to the attached drawings where:

FIG. 1: discloses an example of a housing main body of an electronic device of the present disclosure in perspective side view;

FIG. 2: discloses a schematic layout of an example of an antenna according to the disclosure;

FIG. 3: discloses the housing main body of FIG. 1 in perspective of another side view;

FIG. 4: discloses a schematic layout of an antenna according to a specific embodiment of the disclosure;

DETAILED DESCRIPTION OF EMBODIMENTS

Figure 5:
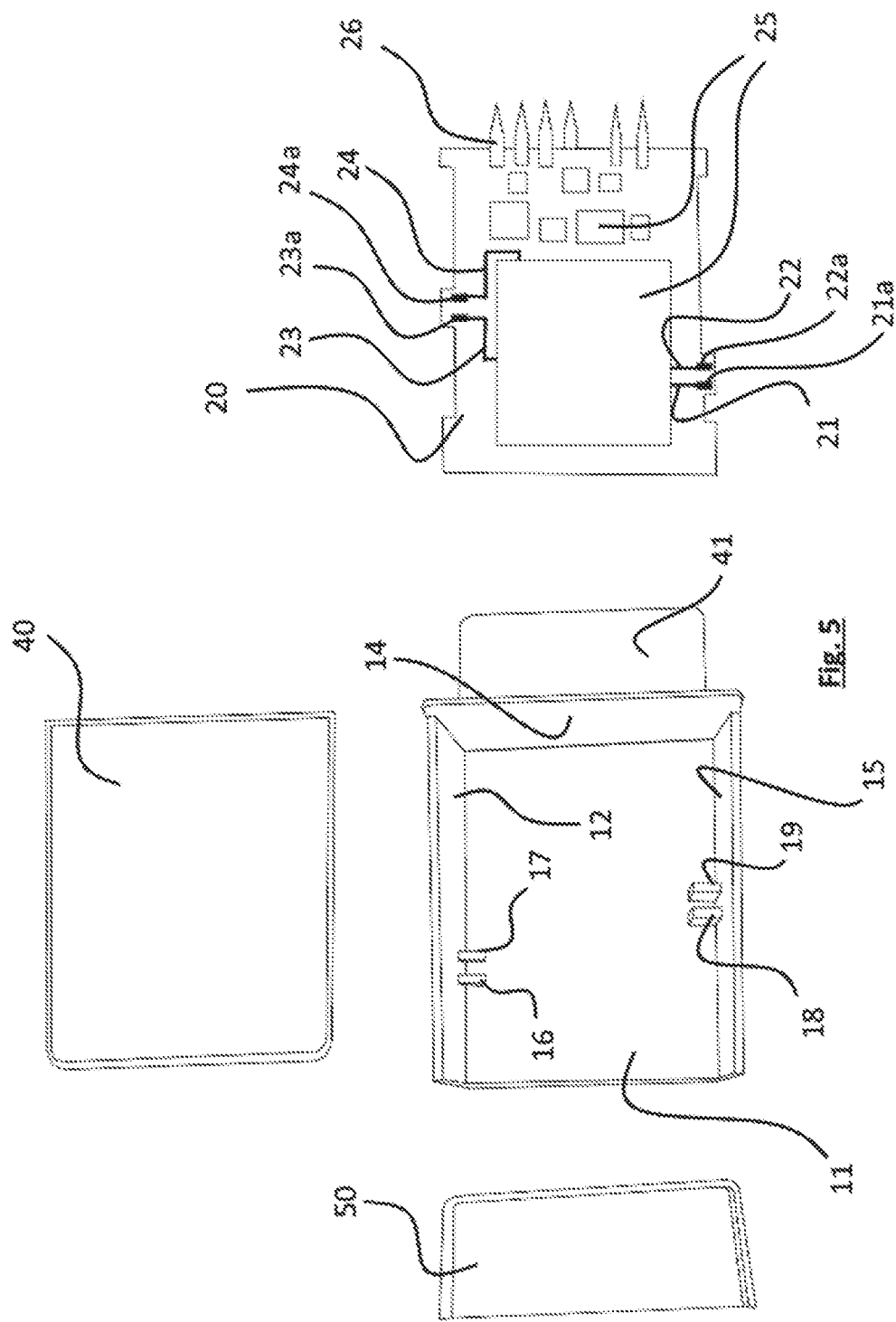
FIG. 5: discloses an upper view of parts of an example of electronic device according to the disclosure.

The exemplary device depicted in FIG. 5 is an electronic device having a main housing part 10, an upper cover 40 and a back cover 50. This housing receives a PCB 20. The housing is made of composite material comprising an organic polymeric material filled with conductive particles or compound as known in the art of laser structuring.

On the PCB are located electronic components 25 and soldered pin or blade contacts 26 which exit the housing through a front wall 14 of the housing and are surrounded by a skirt 41 of a plug connector housing which is used to connect the electronic device to a socket connector in an automobile.

According to the disclosed embodiment of FIG. 1, the main housing part of the device has electrically conductive layers made through laser direct structuring and forming a first main antenna described in FIG. 2.

This antenna is made through LDS technology which comprises the use of a laser-activatable thermoplastic doped with a special additive. Activation of the thermoplastic is done with a laser beam in order that a physical-chemical reaction forms metallic nuclei. These act as a catalyst for reductive copper plating. In addition to activation, the laser creates a microscopically rough surface in which the copper is firmly anchored during a following metallization process. Metallization of the LDS parts starts with a cleaning step. Then follows an additive build-up of tracks of typically 5 µm to 10 µm thickness with the help of electroless copper baths. Lastly follows plating with currentless nickel to finish the antenna layout. This antenna is, in the present application, a main 4G antenna which could also be used as a GPS/GSM/BT Antenna or 3G or 5G antenna allowing SMS/USSD/GPRS (TCP/UDP) transmissions for remote diagnostic, crash detection or other applications having real time or remote monitoring needs. The antenna may also be used for WIFI communications.

In the present application, difficulties arise since 4G bands may be within the 600 MHz or 2 GHz range, are narrow and close to each other. In such a situation, a large antenna is preferred but in the present case, the housing of the device must remain small, around 4 cm and cm length, around 3 to 5 cm width and around 1 cm to 3 cm thick due to its location within the car.

In addition design of the antenna must take care of the proximity and location of the PCB within the device, the ground plane(s) of the PCB and possibly a battery cell of the device all constraints that limit the design possibilities for the antenna.

The present design where the antenna surface is increased due to its location on several interior and exterior faces of the housing permits to provide sufficient transmission/reception capabilities despite those constraints.

The polymeric matrix of the housing may be made of a polymer used in automotive applications.

According to FIG. 2 the first antenna may comprise a first portion 2, 3 inside the housing, a third portion 5 outside the housing and a second portion forming a junction area 4 between the first portion and the third portion. The first portion is located inside the housing. The third portion 5 outside the housing is located on the exterior of a sidewall 12 of the housing and is perpendicular to the PCB. The third portion 5 of the antenna is the main emitting/receiving part of the antenna and, due to its position outside the housing, such part is less subject to interferences with the PCB components inside the housing.

The second portion which is a junction area between the first part and the second part of the antenna may be located on the edge 13 of the side wall 12 and also made through laser direct structuring on said edge 13 of the sidewall 12. In order to avoid an oversize of the edge where copper is deposited on the plastic of the housing, a reduced height of the lateral wall 12 may be provided on the junction area where the structuring is done.

The first portion may comprise a first flat area 2 on a first bottom wall 11 of the housing, which is parallel to the PCB, and a second flat area 3 on the sidewall 12 of the housing perpendicular to the bottom wall 11. The second flat area is perpendicular to the PCB inside the housing and parallel to the third portion outside the housing. The antenna is folded at a junction between the first flat area 2 and the second flat area 3. The first flat portion has connecting members 8*a*, 8*b*, 9*a*, 9*b* which connect the antenna to contact terminals 6, 7 located on the top of studs 16, 17 for contacting contact pads 21*a*, 22*a* of the PCB depicted on FIG. 5. The connecting members comprise segments 8*a*, 9*a* along sides of the studs to link the contact terminals and connecting lines 8*b*, 9*b* on the bottom wall 11 to connect the first flat area 2 of the first portion of the antenna.

The contact pads may be springy contact elements pressed onto the contact terminals 6, 7 of the connecting members.

The electronic device depicted in FIG. 3 may comprise a secondary antenna 30 shown on FIG. 4. While the main antenna is used for transmission and reception, the secondary antenna, also called diversity antenna, is dedicated to reception in the same frequency bands than the main antenna and used by the receiver automatically in case reception through the main antenna becomes poor.

The second antenna may also be formed through direct structuring process. Such antenna may lie inside the housing as in the drawing or may be located inside and outside the housing as the main antenna.

The second antenna comprises also contact terminals 36, 37 and connecting members 38, 39 for connecting the emitting/receiving part 32 of the antenna to contact pads 23*a*,24*a* of the PCB.

Referring to FIG. 5, the studs 16, 17 which provide a path between the contact pads 21a, 22a of the PCB and the connecting members of the main antenna 1 are on an opposite side from the studs 18, 19 which provide the path between contact pads 23a, 24a of the PCB and the connecting members 38, 39 of the subsidiary antenna 30. In FIG. 5, the PCB is turned upside down to show the tracks 21, 22, 23, 24 and the contact pads 21a, 22a, 23a, 24a connecting the antennas.

The laser structuring process of the main antenna comprises moving the laser source around the housing to heat the bottom wall 11, the lateral wall 12 and the studs 16, 17, the edge 13 of the lateral wall 12 and the exterior of the lateral wall 12.

Figure 6:
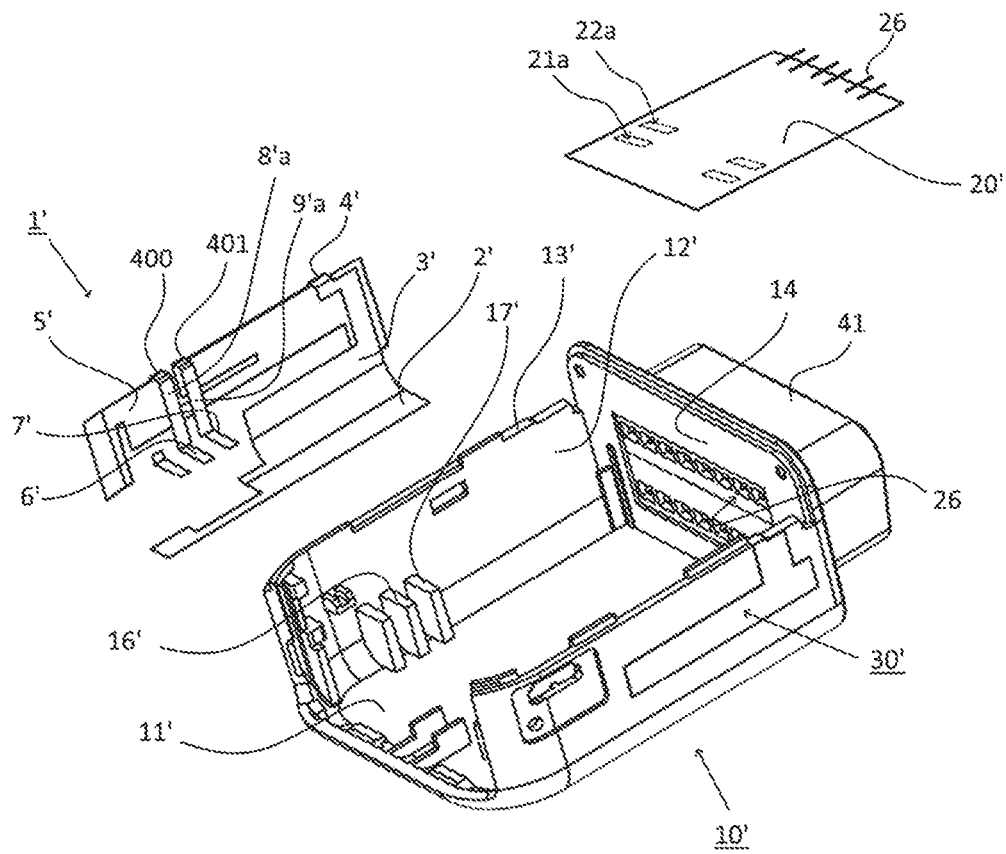
FIG. 6: discloses a second embodiment of the present disclosure.

FIG. 6 represents an exploded view of an embodiment where an antenna 1' shown has a first portion 2', 3' on an internal part of the housing 30', a second portion 4' forming a first junction area on an edge 13' between an interior part and an exterior part of the housing, a third portion 5' on an outer part of the housing in electrical continuity with the first portion through the first junction area and a second junction area 400, 401 connecting said third portion to connecting tracks 8'a, 9'a inside said housing. Here also the antenna is provided through laser structuring directly on the housing. In this embodiment, the first portion may comprise a first flat area 2' on a first wall 11' of the housing, a second flat area 3' on a second wall 12' of the housing perpendicular to the first wall so that said first flat area and second flat area are perpendicular and the antenna may be folded at an inner junction 230 between said first flat area 2' and said second flat area 3' at the rounded surface of the housing between the walls 11' and 12'.

As in the design of FIG. 1, in the design of FIG. 6, the housing houses at least one PCB 20'. The first flat area 2' of the antenna is located on a bottom wall 11' of the housing parallel to the PCB and the second flat area 3' is located is a sidewall 12' of the housing perpendicular to the bottom wall 11' and perpendicular to the PCB inside the housing. The second flat area is also parallel to the third portion 5' of the antenna outside the housing.

The PCB 20' is received on at least first stud elements 16', 17' in the housing and the connecting tracks 8'a, 9'a extend from the first wall 11' onto said stud elements for providing contact terminals 6', 7' for connecting springy contact elements 21'a, 22'a of the PCB.

The stud elements 16', 17' are perpendicular to the bottom wall of the housing and extend along said second wall 12'.

In this embodiment, a second antenna 30' made through a laser direct structuring process may also be connected to the PCB through second stud elements.

The PCB may also comprise pin contacts 26 inserted in a rear wall 14 of a connector housing and protruding within a skirt 41 of said connector housing.

The third portion 5' of the main antenna may be wider than the first and second portions 2', 3'.

Figure 7:
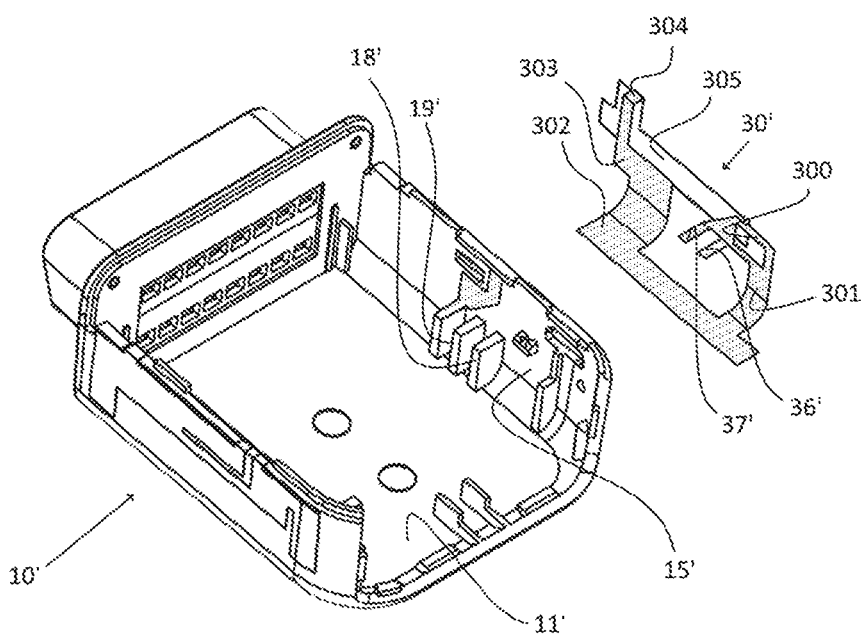
FIG. 7: discloses another embodiment of secondary antenna.

In FIG. 7, the housing may comprise second studs 18',19' for contacting second pads on the PCB. On these studs, connecting tracks 36', 37' of a secondary or diversity antenna 30' are formed through direct structuring process the second antenna 30' has a connecting section 300, a first lateral part 301 on the inner side wall 15' adjacent to the studs 18', 19', a bottom part 302, a second lateral part 303 inside the side wall 15' connected through a junction element 304 to a third lateral part 305 outside the side wall 15'. In this design, the secondary antenna 30' is designed with receiving and/or radiating elements inside and outside the housing in a similar fashion than the main antenna.

With the present designs where junction areas are made on one or more edges 13, 13' of housing walls under a cover element, there is no need of through holes within the housing in order to connect the PCB to the exterior part of the antenna and the housing remains dustproof without the need of an additional cover.

Thickness of the conductive layers forming the antennas the housing is between 5 μm and 10 μm while the thickness of the walls is between 1 mm and 3 mm and the housing is painted, coated with an insulating varnish, a coating or a film to protect and isolate the conductive layers.

The invention is not limited to the example shown and in particular, the shapes of the antennas could be modified to be adapted to other transmission/reception bands.

The invention claimed is:

1. Electronic device having at least one main antenna wherein such antenna is formed as a conductive layer on walls of a housing of the electronic device, said conductive layer comprising a laser structured deposited copper layer on said walls and has:
    a first portion on an internal part of the housing,
    a second portion forming a junction area on an edge between an interior part and an exterior part of the housing and,
    a third portion on an outer part of the housing in electrical continuity with the first portion through the junction area,
    wherein the first portion comprises a first flat area on a first wall of the housing, a second flat area on a second wall of the housing, said main antenna being folded at a junction between the first flat area and the second flat area.

2. Electronic device according to claim 1 wherein the first flat area and second flat area are angled with respect to one another.

3. Electronic device according to claim 2 wherein the first flat area and the second flat area are perpendicular.

4. Electronic device according to claim 1 wherein the housing houses at least one PCB and wherein the first wall on which the first flat area is located is a bottom wall of the housing parallel to the PCB, and wherein the second wall on which the second flat area is located is a sidewall on the of the housing, said second flat area being angled with respect to the PCB inside the housing and parallel to the third portion outside the housing.

5. Electronic device according to claim 4 wherein said PCB is received on at least first stud elements in the housing wherein the first portion comprises connecting members extending onto said stud elements for providing contact terminals for connecting tracks of the PCB with the antenna, and wherein said connecting members extend from the first wall onto said stud elements.

6. Electronic device according to claim 5 wherein said studs are angled with respect to the bottom wall of the housing and extend along said second wall which forms a sidewall of the housing.

7. Electronic device according to claim 6 wherein said main antenna comprises a first plane on the bottom wall of the housing a second plane on the interior side of the sidewall of the housing, a junction segment on an edge of said sidewall and a third plane on the outer side of said sidewall.

8. Electronic device according to claim 5 wherein connections between tracks of the PCB and connecting members on said stud elements is done through springy contact elements located on said PCB.

9. Electronic device according to claim 4 comprising a second antenna also formed as a second conductive layer on the walls of the housing of the electronic device, said second conductive layer comprising a second laser structured deposited copper layer on said walls, connected to the PCB through connecting members on second stud elements.

10. Electronic device according to claim 4 wherein said second flat area is perpendicular with respect to the PCB inside the housing and parallel to the third portion outside the housing.

11. Electronic device according to claim 1 where the housing comprises a connector housing and wherein the PCB comprises pin contacts inserted in a rear wall of said connector housing and protruding within a skirt of said connector housing.

12. Electronic device according to claim 1 where the third portion of the main antenna is wider than the first and second portions.

13. Electronic device according to claim 1 where the thickness of the copper layer is between 5 μm and 10 μm while the thickness of the walls of the housing is between 1 mm and 3 mm.

14. Electronic device according to claim 1 where the copper layer is covered by a protective nickel layer.

15. Electronic device according to claim 1 where the housing is covered with paint or an electrically isolating coating or film to protect the antenna.

16. Electronic device according to claim 1 wherein the second flat area and the third portion are located on opposite sides of a common wall.

17. Electronic device having at least one main antenna wherein such antenna is formed as a conductive layer on walls of a housing of the electronic device, said conductive layer comprising a deposited copper layer on said walls and has a first portion on an internal part of the housing, a second portion forming a first junction area on an edge between an interior part and an exterior part of the housing, a third portion on an outer part of the housing in electrical continuity with the first portion through the first junction area and a second junction area connecting said third portion to connecting tracks inside said housing and wherein the first portion comprises a first flat area on a first wall of the housing, a second flat area on a second wall of the housing perpendicular to the first wall so that said first flat area and second flat area are perpendicular, said main antenna being folded at an inner junction between said first flat area and said second flat area, and wherein the housing houses at least one PCB and wherein the first wall on which the first flat area is located is a bottom wall of the housing parallel to the PCB, and wherein the second wall on which the second flat area is located is a sidewall of the housing perpendicular to the bottom wall, said second flat area being perpendicular to the PCB inside the housing and parallel to the third portion outside the housing.

18. Electronic device according to claim 17 wherein said PCB is received on at least first stud elements in the housing wherein said connecting tracks extend from the first wall onto said stud elements for providing contact terminals for contacting contact elements of the PCB.

19. Electronic device according to claim 18 wherein said stud elements are perpendicular to the bottom wall of the housing and extend along said second wall.

20. Electronic device according to claim 17 comprising a second antenna, formed as a second conductive layer on at least one wall of the housing of the electronic device, comprises a second deposited copper layer and connected to the PCB through second stud elements.

21. Electronic device according to claim 17 where the housing comprises a connector housing and wherein the PCB comprises pin contacts inserted in a rear wall of said connector housing and protruding within a skirt of said connector housing.

22. Electronic device according to claim 17 where the third portion of the main antenna is wider than the first and second portions.

23. Electronic device according to claim 17 where the thickness of the copper layer is between 5 μm and 10 μm while the thickness of the walls of the housing is between 1 mm and 3 mm.

24. Electronic device according to claim 17 where the copper layer is covered by a protective nickel layer.

25. Electronic device according to claim 17 where the housing is covered with paint or an electrically isolating coating or film to protect the antenna.

* * * * *